United States Patent [19]

Hiroshi

[11] Patent Number: 5,418,483

[45] Date of Patent: May 23, 1995

[54] CUT-OFF FREQUENCY SETTING CIRCUIT OF A FILTER CIRCUIT

[75] Inventor: Yamaguchi Hiroshi, Ikoma, Japan

[73] Assignee: Sharp Kabushiki Kaisha, Osaka, Japan

[21] Appl. No.: 30,549

[22] Filed: Mar. 12, 1993

[30] Foreign Application Priority Data

Mar. 13, 1992 [JP] Japan .................. 4-055396

[51] Int. Cl.[6] .............................................. H03K 5/00
[52] U.S. Cl. ...................... 327/553; 327/66; 327/564
[58] Field of Search ............ 307/568, 520, 521, 494, 307/556, 303; 328/167, 165; 330/107, 109

[56] References Cited

U.S. PATENT DOCUMENTS

| | | | |
|---|---|---|---|
| 4,045,731 | 8/1977 | Tokunov et al. .................. 330/109 |
| 4,392,068 | 7/1983 | Welles, II ........................ 302/520 |
| 4,451,795 | 5/1984 | Kilian ............................. 330/107 |
| 4,812,773 | 3/1989 | Yamamoto et al. .............. 307/520 |
| 4,890,259 | 12/1989 | Simko ............................ 365/45 |
| 5,023,491 | 6/1991 | Koyama ......................... 328/167 |
| 5,101,509 | 3/1992 | Lai ................................. 455/183 |

Primary Examiner—Timothy P. Callahan
Assistant Examiner—Dinh Le
Attorney, Agent, or Firm—Birch, Stewart, Kolasch & Birch

[57] ABSTRACT

A cut-off frequency setting circuit of a filter circuit comprises a filter circuit possessing an analog signal input terminal for adjustment of the cut-off frequency, a memory capable of rewriting data, and a D/A converter for producing an analog current according to the output data from the memory and for supplying the analog current into the analog input terminal for adjustment of the cut-off frequency of the filter circuit.

2 Claims, 5 Drawing Sheets

PRIMARY LPF

CUT-OFF FREQUENCY SETTING CIRCUIT OF A FILTER CIRCUIT

BACKGROUND OF THE INVENTION

1. Field of the Invention

The present invention relates to a cut-off frequency setting circuit of a filter circuit, and more particularly to a cut-off frequency setting circuit of a filter circuit composed of an IC.

2. Description of the Related Art

FIG. 1 shows a conventional cut-off frequency setting circuit. In this prior art, in order to set the cut-off frequency of a primary low-pass filter circuit 1 composed of a pair of differential transistors Q3, Q4, a transistor Q2 for constant-current source, transistors Q5, Q6 connected for composing a current mirror, an emitter follower Q7, capacitance C1 and others, an analog current is supplied to the base and collector of the transistor Q1 for forming the current mirror circuit 2 together with the transistor Q2 for providing a constant-current source from the outside through an analog input terminal 5 for adjustment of cut-off frequency, thereby setting the cut-off frequency of the filter circuit 1.

An analog current generating circuit 3 externally attached to the outside is composed of, for example, resistances R1, R2 connected between a supply voltage +B and the ground. In FIG. 1, numeral 4 denotes a signal input terminal for feeding in the signal to be filtered in the filter circuit 1, and Vcc is a power source in an IC (Integrated Circuit) 18.

In the conventional circuit, however, when one attempts to change the cut-off frequency of the filter circuit 1, external parts (resistances R1 and R2 in the case of FIG. 1) must be exchanged. Accordingly, in the prior art, not only the external circuit needed, but also a space must be kept for the external circuit when mounting on a circuit board, which makes high density mounting difficult.

Besides, by fluctuations of the supply voltage +B, the analog current varies, and thereby the input current and output current of the current mirror circuit 2 change. Fluctuations of the output current of the current mirror circuit 2 cause fluctuations of constant-current of the filter circuit 1, which leads to variations of dynamic resistances of the transistors Q3, Q4, and thereby the cut-off frequency of the filter circuit 1 changes.

SUMMARY OF THE INVENTION

It is hence a primary object of the invention, being devised in the light of these problems, to present a cut-off frequency setting circuit capable of setting the cut-off frequency accurately in a simple constitution, wherein one can easily change the cut-off frequency, and wherein the circuit is capable of mounting on a circuit board at high density.

To achieve the above object, the cut-off frequency setting circuit of a filter circuit of the invention comprises a filter circuit 1 possessing an analog signal input terminal 5 for adjustment of cut-off frequency, a memory 10 capable of rewriting data, and a D/A converter 11 for producing an analog current according to the output data from the memory 10 and for supplying the analog current into the analog input terminal 5 for adjustment of the cut-off frequency of the filter circuit 1.

In such a constitution, since the memory 10 and D/A converter 11 for generating an analog signal for adjustment of the cut-off frequency of filter circuit 1 can be formed on the same IC chip together with the filter circuit 1, an external circuit for setting the cut-off frequency is not needed. In addition, setting or changing of the cut-off frequency can be changed by rewriting the memory 10, and thus it is not necessary to make any change in the hardware.

Furthermore, the D/A converter 11 for generating the analog current is also formed in the IC chip, which makes it possible to obtain an analog current, and hence the cut-off frequency of a filter circuit, free from the effects of fluctuations of supply voltage or the like.

According to the invention, as described herein, since the memory and D/A converter for generating an analog signal for adjustment of cut-off frequency of filter circuit can be formed on a same IC chip together with the filter circuit, external circuit for setting the cut-off frequency is not needed. Therefore, the mounting density is enhanced in the circuit board for mounting the filter circuit and its cut-off frequency setting circuit. Besides, setting or changing of cut-off frequency can be changed by rewriting the memory, and it is not necessary to make any change in the hardware.

BRIEF DESCRIPTION OF THE DRAWINGS

Other and further objects, features, and advantages of the invention will be more explicit from the following detailed description taken with reference to the drawings wherein.

DETAILED DESCRIPTION OF THE PREFERRED EMBODIMENT

Figure 1:
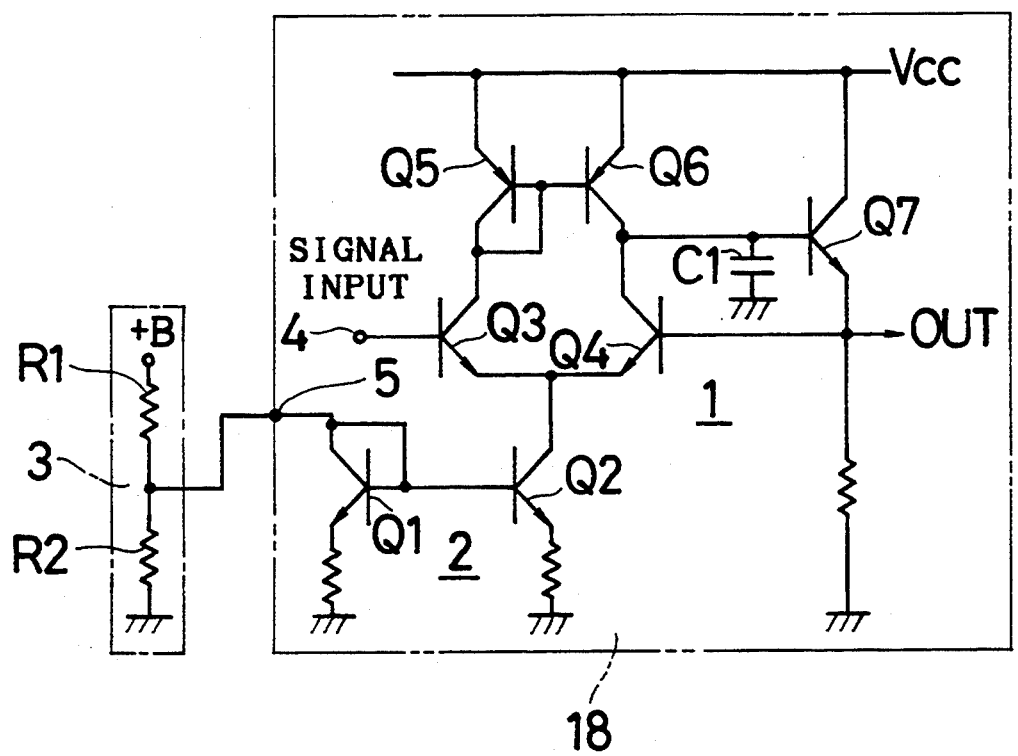
FIG. 1 is a circuit diagram of a prior art cut-off frequency setting circuit of a filter circuit.

Now referring to the drawing, preferred embodiments of the invention are described below.

Figure 2:
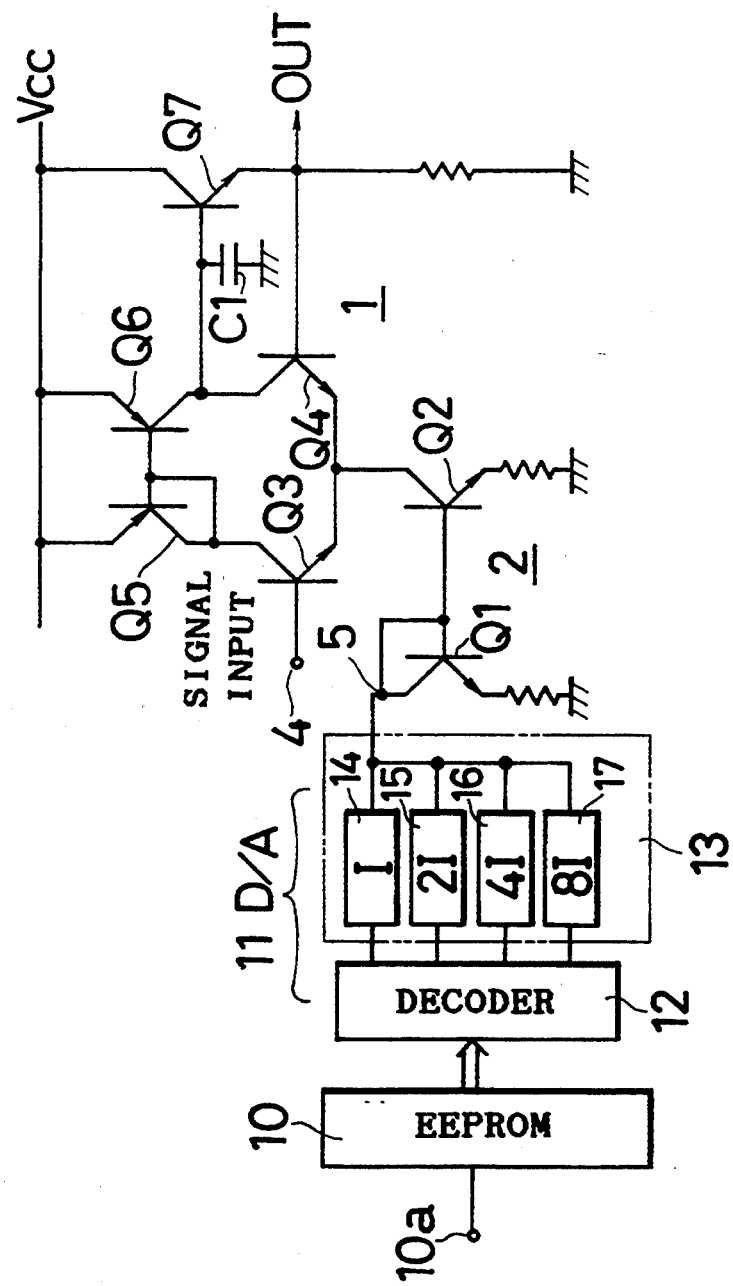
FIG. 2 is a block diagram of a cut-off frequency setting circuit of a filter circuit according to the invention.

FIG. 2, shows an embodiment of the invention wherein the same parts as in the prior art in FIG. 1 are identified with same reference numerals and duplicate explanations thereof will omitted. In FIG. 2, numeral 10 is a memory composed of EEPROM (Electrically Erasable Programable Read Only Memory) that can be rewritten, and its output data is decoded by a decoder 12 of a D/A (Digital/Analog) converter 11, and a current generating part 13 is controlled by its decoded output. More specifically, the decoded output is a four-bit digital value, and each bit is connected with one of current value circuits 14 to 17 and, when the bit is "1", the connected current value circuit is turned on.

The current value circuits 14, 15, 16, 17 are designed to produce constant-currents of I, 2·I, 4·I, and 8·I, respectively, when turned on, and for example when the decoded output is (0011), the current value circuits 14 and 15 are turned on, and the output of the D/A converter 11 is 3·I, and hence the analog current entering the current mirror circuit 2 is 3·I. At this time, the output current of the transistor Q4 is also 3·I, and therefore the cut-off frequency of the filter circuit 1 is a value corresponding to the constant-current 3·I.

Next, to vary the cut-off frequency of the filter circuit 1, the memory 10 is rewritten through a rewrite terminal 10a. As a result, supposing the output of the decoder 12 to be (1010), this time, the current value circuits 15 and 17 are turned on, and therefore the output of the D/A converter 11 is 10·I, and the cut-off frequency of the filter 1 becomes a value corresponding to the constant current 10·I.

In FIG. 2, since the memory 10 and D/A converter 11 can be formed on the same IC chip together with the filter circuit 1 and current mirror circuit 2, the entire constitution is compact. The current value circuits 14 to 17 of the D/A converter 11 may be composed so as to produce stable constant-currents, not influenced by the fluctuations of supply voltage, temperature or other changes by the present IC technology.

The cut-off frequency setting circuit of the invention may be utilized in a general active filter. It can be therefore applied in a low-pass filter, a high-pass filter, a band-pass filter, or a combination filter. Meanwhile, so as to be capable of being formed on an IC chip, it is preferred to use an active filter having a cut-off frequency in the range from several kHz to scores of MHz.

For example, the cut-off frequency setting circuit of the invention is supposed to be used in a signal processing filter of a read circuit of floppy disk drive. In this case, when compensating for the fluctuations of characteristics of a reading head and other parts, or when changing the parts, the cut-off frequency of the filter must be changed. Conventionally, it was necessary to exchange the resistances which are external parts, whereas, in the invention, it is enough to rewrite the content of the memory 10, which can be done easily in a short time.

Figure 3:
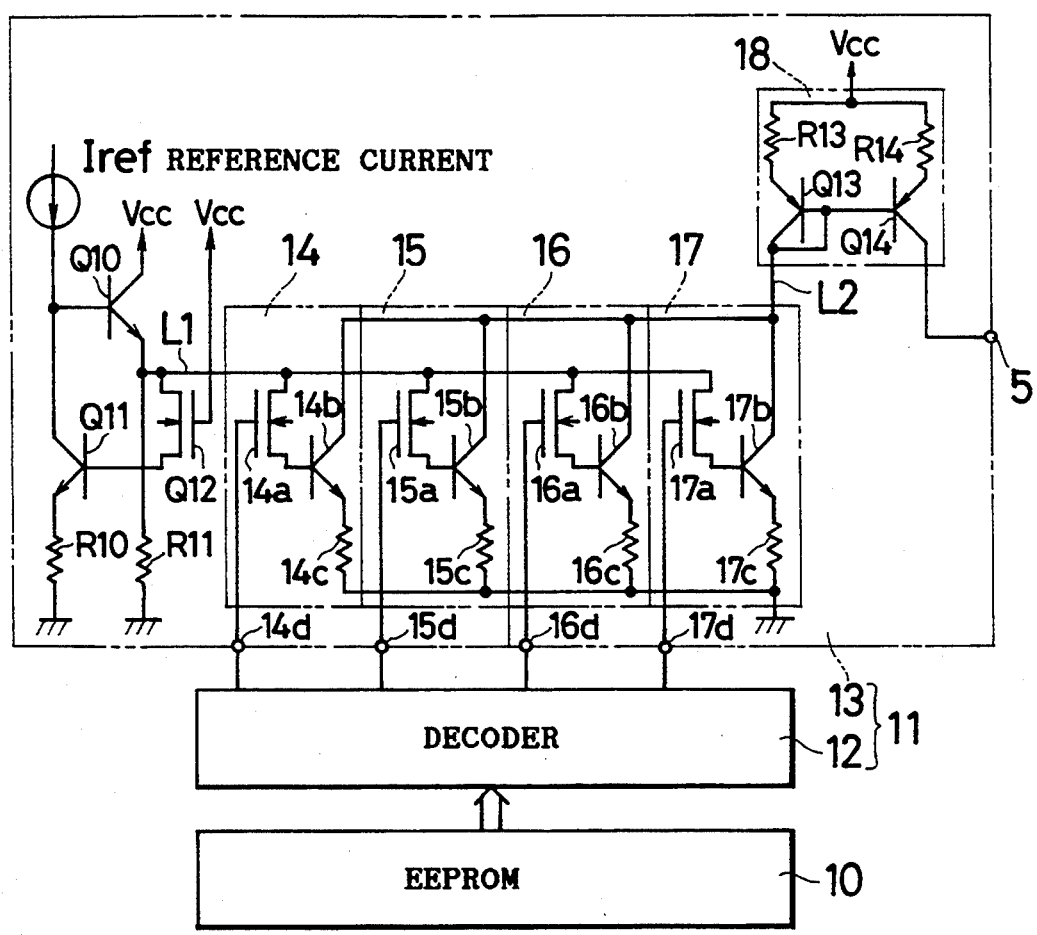
FIG. 3 is the circuit diagram showing a structural example of the current generating part 13.

FIG. 3 is a circuit diagram showing an example of the current generating part 13. Current value circuits 14 to 17 are similar in constitution, and an example of the current value circuit 14 is explained below. The current value circuit 14 is composed of N-channel-enhancement type MOS-FFT (Metal-Oxide-Semiconductor—Field-Effect-Transistor) 14a, NPN transistor 14b, and resistor 14c. In the FET 14a, the gate is connected to a terminal 14d, the source to a common line L1, and the drain to the base of the transistor 14b, respectively. The output from a decoder 12 is applied to the terminal 14d. In the transistor 14b, the collector is connected to a common line L2, and the emitter is grounded through the resistor 14c.

By the output from the decoder 12, by making FET 14a conducting, a constant-current flows in the transistor 14b. In the other current value circuits 15 to 17, similarly, the output from the decoder 12 is applied to the gates of the FET 15a to 17a through terminals 15d to 17d to control FETs 15a to 17a, so that a constant-current flows in the transistors 15b to 17b. Therefore, the current flowing in the common line L2 is the sum of the currents flowing in the current value circuits 14 to 17.

Herein, the resistance ratios of the resistors 14c to 17c of the current value circuits 14 to 17 are selected as follows.

$$14c:15c:16c:17c = 8:4:2:1 \quad (1)$$

Hence, supposing the current flowing in the current value circuit 14 to be I, a current of 2·I flows in the current value circuit 15, 4·I in the current value circuit 16, and 8·I in the current value circuit 17. Therefore, currents of I to 15·I flow in the common line L2.

The common line L2 is connected to the collector and the base of the PNP transistor Q13 for composing a current mirror circuit 18. Therefore, the same current as in the common line L2 flows in the other PNP transistor Q14. The current flowing in the transistor Q14 is given to the analog input terminal 5. To the emitters of the transistors Q13, Q14, a supply voltage Vcc is applied through resistors R13, R14.

To the common line L1, the source of the FET Q12 is connected. The supply voltage Vcc is applied to the gate of FET Q12, and its drain is connected to the base of the transistor Q11. In the transistor Q11, the emitter is grounded through resistor R10, and a reference current Iref is applied to the collector. The reference current Iref is applied also to the base of transistor Q10. In the transistor Q10, the supply voltage Vcc is applied to the collector, and the emitter is connected to the common line L1, and is grounded through resistor R11.

Figure 4A:
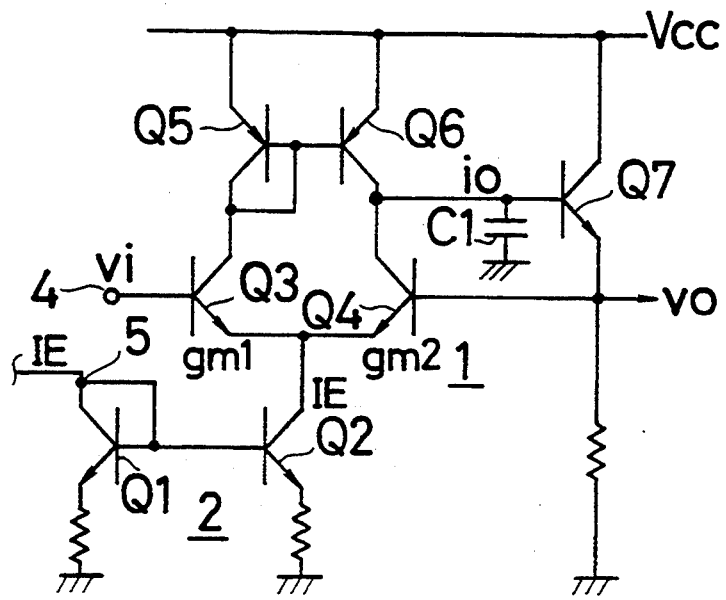
FIG. 4(a) and FIG. 4(b) are diagrams for explaining the relation of the current IE and cut-off frequency fc in the filter circuit 1.
Figure 4B:
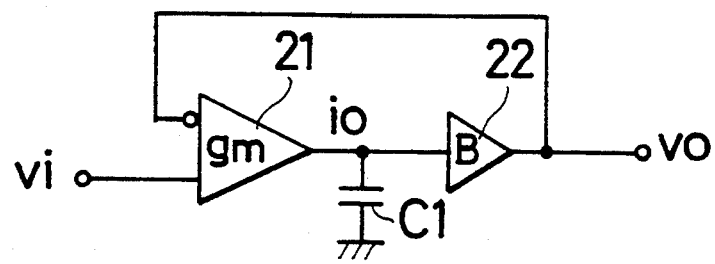

FIG. 4(a) is a diagram for explaining the relation of the current IE and cut-off frequency fc in the filter circuit 1. FIG. 4(b) is a block diagram showing a simplified view of the filter circuit 1 in FIG. 4(a). An amplifier 21 denotes transistors Q3 to Q6, and a buffer 22 indicates a transistor Q7. In FIG. 4(a), the voltage of the input signal is the vi, the voltage of output signal is vo, the current flowing in the current mirror circuit 2 is IE, the alternating current flowing into the capacitor C1 is io, the mutual conductances of the transistors Q3, Q4 is gm1, gm2, and the mutual conductance of the amplifier 21 is gm.

$$gm = gm1 = gm2 = \frac{q}{k \cdot T} \cdot \frac{IE}{2} \quad (2)$$

$$io = gm1 \cdot vi - gm2 \cdot vo \quad (3)$$

where q is the electric charge of electron, k is the Boltzmann constant, and T is the absolute temperature. On the basis of FIG. 4(b), the following equations are established.

$$(-vo + vi)\frac{gm}{S \cdot C1} = vo \quad (4)$$

$$\therefore \left(1 + \frac{gm}{S \cdot C1}\right)vo = \frac{gm}{S \cdot C1} vi \quad (5)$$

$$\therefore \frac{vo}{vi} = \frac{\frac{gm}{S \cdot C1}}{1 + \frac{gm}{S \cdot C1}} = \frac{\frac{gm}{C1}}{S + \frac{gm}{C1}} \quad (6)$$

Herein, seeing that $$S = j \cdot w \quad (7)$$

it follows that $$\frac{vo}{vi} = \frac{\omega 0}{j \cdot \omega + \omega 0}, \text{ where, } \omega 0 = \frac{gm}{C1} \quad (8)$$

Therefore, the cut-off frequency is as follows.

$$fc = \frac{\omega 0}{2 \cdot \pi} = \frac{gm}{2 \cdot \pi \cdot C1} = \frac{q}{4 \cdot \pi \cdot k \cdot T \cdot C1} \cdot IE \quad (9)$$

Figure 5:
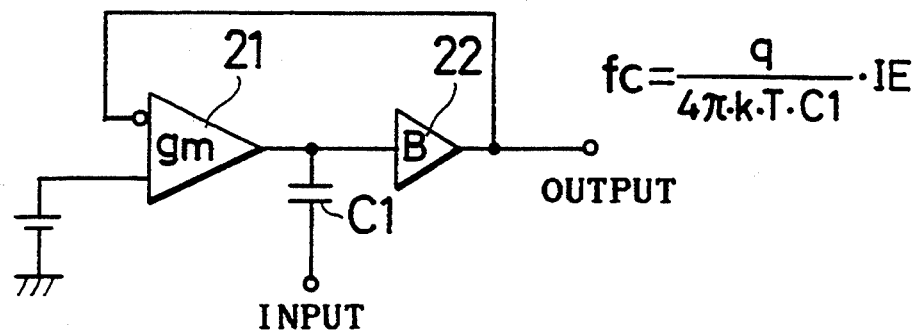
FIG. 5 is a block diagram showing the constitution of a high-pass filter.

FIG. 5 is a block diagram showing the constitution of a high pass filter. The cut-off frequency is $$fc = \frac{q}{4 \cdot \pi \cdot k \cdot T \cdot C1} \cdot IE \quad (10)$$

Figure 6:
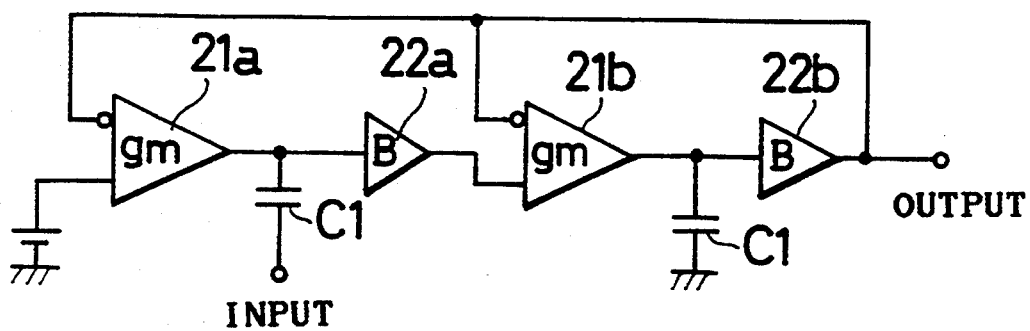
FIG. 6 is a block diagram showing the constitution of a secondary band-pass filter.

FIG. 6 is a block diagram showing the constitution of a secondary band-pass filter. The BPF (Band-Pass Filter) is composed by combining a HPF (High-Pass Filter) and a LPF (Low-Pass Filter). By setting the cut-off frequency of each filter part according to formula (10), only the signal of specific frequency band is delivered.

The invention may be embodied in other specific forms without departing form the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A device including a filter circuit means, a cut-off frequency setting circuit for the filter circuit means and a current mirror for the filter circuit means, all entirely on the same IC chip, said device comprising:

a filter circuit means, including an on-chip capacitor forming a part thereof, an analog signal input terminal for adjustment of cut-off frequency and a pair of differential transistors;

a cut-off frequency setting circuit for said filter circuit, said setting circuit consisting solely of an EEPROM and a D/A converter means for producing an analog current according to the output data from the EEPROM and for supplying the analog current into the analog input terminal so as to adjust a cut-off frequency of the filter circuit; and a current mirror circuit including a pair of transistors connected together at their bases with each transistor having a terminal connected between a reference voltage a respective one said pair of differential transistors;

the filter circuit means, the cut-off frequency setting circuit and the current mirror circuit being entirely on the same IC chip.

2. The apparatus of claim 1, wherein the cut-off frequency can be changed by changing the value in the EEPROM to thereby alter the value of electric current supplied to the analogue input terminal by said D/A converter.

* * * * *